US011903137B2

(12) United States Patent
Gieskes et al.

(10) Patent No.: US 11,903,137 B2
(45) Date of Patent: Feb. 13, 2024

(54) CLINCH MECHANISM FOR ASSEMBLING A PRINTED CIRCUIT BOARD WITH ELECTRONIC COMPONENTS

(71) Applicant: Universal Instruments Corporation, Conklin, NY (US)

(72) Inventors: Koenraad Alexander Gieskes, Deposit, NY (US); Joan Sorin Nicolescu, Canadensis, PA (US)

(73) Assignee: UNIVERSAL INSTRUMENTS CORPORATION, Conklin, NY (US)

( * ) Notice: Subject to any disclaimer, the term of this patent is extended or adjusted under 35 U.S.C. 154(b) by 755 days.

(21) Appl. No.: 16/900,207

(22) Filed: Jun. 12, 2020

(65) Prior Publication Data
US 2020/0396876 A1 Dec. 17, 2020

Related U.S. Application Data

(60) Provisional application No. 62/861,469, filed on Jun. 14, 2019.

(51) Int. Cl.
*H05K 13/04* (2006.01)
*H05K 3/04* (2006.01)
(Continued)

(52) U.S. Cl.
CPC ......... *H05K 13/0473* (2013.01); *H05K 3/043* (2013.01); *B21F 11/00* (2013.01);
(Continued)

(58) Field of Classification Search
CPC ............. H05K 13/0473; H05K 13/043; H05K 13/0061; H05K 3/043; H05K 13/0076; B22F 11/00; Y10T 29/53183
See application file for complete search history.

(56) References Cited

U.S. PATENT DOCUMENTS

4,125,136 A * 11/1978 Olcese ............... H05K 13/0473
                                                                83/929.2
4,151,637 A *  5/1979 Zemek ............... H05K 13/0473
                                                                29/33 M
(Continued)

FOREIGN PATENT DOCUMENTS

CN          202006259 U      10/2011
CN          102554074 A       7/2012
(Continued)

OTHER PUBLICATIONS

Geren et al, "Automated removal and replacement of through-hole components in robotic rework," in IEEE Transactions on Components, Packaging, and Manufacturing Technology: Part C, vol. 20, No. 3, pp. 236-248, Jul. 1997. (Year: 1997).*

*Primary Examiner* — A. Dexter Tugbang
(74) *Attorney, Agent, or Firm* — Schmeiser, Olsen & Watts, LLP

(57) ABSTRACT

A clinch mechanism for assembling a printed circuit board with electronic components includes a drive shaft configured to move along a vertical axis, a stationary anvil configured to remain stationary during movement of the drive shaft, a cutter having a cutting tip, and a toggle configured to rotate about a toggle rotation axis that includes an involute gear shaped tooth configured to roll across an involute trapezoidal slot of the cutter in order to impart movement on the cutter relative to the stationary anvil. Movement of the drive shaft along the linear axis is configured to move the cutter relative to the stationary anvil, and to move the cutting tip across the stationary anvil to cut an electronic lead located between the cutting tip and the stationary anvil, and to rotate the toggle about the axis.

20 Claims, 10 Drawing Sheets

(51) Int. Cl.
  *H05K 13/00* (2006.01)
  *B21F 11/00* (2006.01)
(52) U.S. Cl.
  CPC ..... *H05K 13/0061* (2013.01); *H05K 13/0076* (2013.01); *Y10T 29/53183* (2015.01)

(56) References Cited

U.S. PATENT DOCUMENTS 4,388,848 A * 6/1983 Albert ................ H05K 13/0473
  83/929.2
4,630,354 A * 12/1986 Staviski ............. H05K 13/0473
  29/838

FOREIGN PATENT DOCUMENTS

CN         206936238 U      1/2018
JP         2013115293 A *   6/2013

* cited by examiner

CLINCH MECHANISM FOR ASSEMBLING A PRINTED CIRCUIT BOARD WITH ELECTRONIC COMPONENTS

RELATED APPLICATIONS

This application claims priority to U.S. provisional patent application No. 62/861,469 filed Jun. 14, 2019, entitled "Improved Cut/Clinch Mechanism for a Radial Electronics Component Insertion Machine," the disclosure of which are hereby incorporated by reference.

FIELD OF THE DISCLOSURE

The invention relates to a clinch mechanism for assembling a printed circuit board with electronic components. More particularly, the invention relates to a clinch mechanism for cutting electronic component leads after having been inserted into a printed circuit board.

BACKGROUND

When assembling electronic components on a printed circuit board (PCB), a radial lead insertion machine inserts component leads of the electronic components through the holes of the PCB and in the same motion through the opening between a cutter and an anvil part of a clinch mechanism under the PCB. The cutter is the active part, moving to create the cutting action and the anvil is the stationary part, which the lead will be pressed against by the moving cutter during the cutting. The cutter continues the pushing action after the lower part of the lead is removed by the anvil, bending the lead up against the bottom of the PCB. The clinch mechanism thus cuts the leads, protruding from the bottom of the PCB, to the desired length and subsequently bends, or clinches and bends the leads close to the bottom of the PCB to hold the component in place for the following process steps until the PCB is wave soldered or the component is soldered in place by hand or by an automatic selective soldering machine. A desirable outcome of the clinch process is a short lead, which is bent tight close to the PCB bottom surface.

Prior art clinch mechanisms, for example, are driven by a vertical linear movement generated by an air cylinder or by a cam/servo mechanism. This vertical movement directly, or via a toggle arm, moves the cutters towards and over the anvils, while cutting the leads and bending the leads to create a clinch of the component. Prior art clinch mechanisms connect the vertical movement to the toggles and to the cutters with pins, or cylindrically shaped parts, which slide on flat steel surfaces. This leads to unnecessary wear of these parts. In one configuration a prior art clinch mechanism moves the cutters parallel to the bottom of the PCB. This leads to high forces on the leads during the cutting and clinching process. Often the cutter and anvil parts are elaborately machined and ground out of hardened steel, which makes these wearable parts expensive to replace.

One disadvantage of using round pins that slide on flat surfaces is that such a configuration leads to excessive wear, requiring frequent replacement of these parts. Cutter parts that are machined and ground on all sides out of hardened tool steel are expensive to manufacture.

Another disadvantage of some of prior art clinch mechanisms is the horizontal movement of the cutter over the anvil. During the cutting stage the lead is held tight between the cutter and the anvil. Continued horizontal movement of the cutter puts a high pull force on the lead and thus on the connection between the lead and the electronic component above the PCB. For some combinations of lead materials, thickness and connection type to the electronic component this force is unacceptably high, and the electronic component can be damaged by the cut and clinch process.

Thus, an improved clinch mechanism for assembling a printed circuit board with electronic components would be well received in the art.

SUMMARY

In one embodiment, a clinch mechanism for assembling a printed circuit board with electronic components comprises: a drive shaft configured to move along a vertical axis; a stationary anvil configured to remain stationary during movement of the drive shaft; a cutter having a cutting tip, wherein movement of the drive shaft along the linear axis is configured to move the cutter relative to the stationary anvil, wherein the movement of the cutter by the drive shaft is configured to move the cutting tip across the stationary anvil to cut an electronic lead located between the cutting tip and the stationary anvil; and a toggle configured to rotate about a toggle rotation axis, wherein movement of the drive shaft along the vertical axis is configured to rotate the toggle about the axis, the toggle including a contact portion configured to roll across an engagement portion of the cutter in order to impart movement on the cutter relative to the stationary anvil, wherein the contact portion of the toggle includes an involute gear shaped tooth and wherein the contact portion of the cutter includes an involute trapezoidal slot.

Additionally or alternatively, the involute gear shaped tooth is configured to roll across the involute trapezoidal slot of the cutter to impart movement on the cutter relative to the stationary anvil without a sliding pin extending through the toggle and the cutter.

Additionally or alternatively, the cutter and the stationary anvil are each machined from a flat plate.

Additionally or alternatively, the clinch mechanism further comprises a plurality of cutters and a plurality of corresponding stationary anvils, wherein movement of the drive shaft along the linear axis is configured to move each of the plurality of cutters relative to the corresponding stationary anvils simultaneously.

Additionally or alternatively, the plurality of cutters and the plurality of corresponding stationary anvils comprise a first stack and a second stack and wherein each of the first stack and the second stack include at least one of the plurality of cutters and at least one of the plurality of corresponding stationary anvils.

Additionally or alternatively, the cutter is configured to move linearly along an axis that is not perpendicular to the vertical axis.

Additionally or alternatively, the clinch mechanism further comprises a link rotatably attached to and extending between each of the drive shaft and the toggle, wherein the drive shaft includes a first pin about which the link is configured to rotate when the drive shaft moves along the vertical axis, and wherein a second pin extends through each of the toggle and the link about which the toggle and link are configured to rotate.

Additionally or alternatively, the toggle is configured to rotate about a fixed pin that is aligned with the toggle rotation axis, wherein the toggle is further configured to rotate about the second pin, wherein the second pin is configured to rotate about the fixed pin when the drive shaft moves along the vertical axis.

Additionally or alternatively, the first pin is not configured to slide relative to the link.

In another embodiment, an assembly machine comprises: a board handling system configured to move a printed circuit board within the assembly machine; one or more assembly heads configured to pick and place components onto the printed circuit board; and a clinch mechanism that includes: a drive shaft configured to move along a vertical axis; a stationary anvil configured to remain stationary during movement of the drive shaft; a cutter having a cutting tip, wherein movement of the drive shaft along the linear axis is configured to move the cutter relative to the stationary anvil, wherein the movement of the cutter by the drive shaft is configured to move the cutting tip across the stationary anvil to cut an electronic lead located between the cutting tip and the stationary anvil; and a toggle configured to rotate about a toggle rotation axis, wherein movement of the drive shaft along the vertical axis is configured to rotate the toggle about the axis, the toggle including a contact portion configured to roll across an engagement portion of the cutter in order to impart movement on the cutter relative to the stationary anvil, wherein the contact portion of the toggle includes an involute gear shaped tooth and wherein the contact portion of the cutter includes an involute trapezoidal slot.

In another embodiment, a method of assembling a printed circuit board with electronic components comprises: receiving, by a clinch mechanism, at least one component lead between a cutter and a stationary anvil of the clinch mechanism; moving, by a drive shaft of the clinch mechanism, along a vertical axis; rotating a toggle, by the moving of the drive shaft, about a toggle rotation axis; rolling, by a contact portion of the toggle, across a contact portion of the cutter as a result of the rotating of the toggle, wherein the contact portion of the toggle includes an involute gear shaped tooth and wherein the contact portion of the cutter includes an involute trapezoidal slot; imparting movement, by the contact portion of the toggle, on the cutter relative to the stationary anvil; and cutting the at least one component lead by moving a cutting tip of the cutter across the stationary anvil.

Additionally or alternatively, the method further includes inserting, by a radial lead insertion machine, the at least one component lead of an electronic component through at least one hole in a printed circuit board located above the clinch mechanism.

Additionally or alternatively, the method further includes bending, by the cutter, the cut at least one component lead against the printed circuit board.

Additionally or alternatively, the method further includes rolling, by the involute gear shaped tooth of the toggle, across the involute trapezoidal slot of the cutter; and imparting movement, by the involute gear shaped tooth of the toggle, on the cutter relative to the stationary anvil without a sliding pin extending through the toggle and the cutter.

Additionally or alternatively, the cutter and the stationary anvil are each machined from a flat plate.

Additionally or alternatively, the clinch mechanism includes a plurality of cutters and a plurality of corresponding stationary anvils, wherein the moving of the drive shaft along a vertical axis moves each of the plurality of cutters relative to the corresponding stationary anvils simultaneously.

Additionally or alternatively, the method further includes moving the cutter linearly along an axis that is not perpendicular to the vertical axis.

Additionally or alternatively, the method further includes rotating a link that is attached to and extending between each of the drive shaft and the toggle, by the vertical movement of the drive shaft, wherein the drive shaft includes a first pin about which the link is configured to rotate when the drive shaft moves along the vertical axis, and wherein a second pin extends through each of the toggle and the link about which the toggle and link are configured to rotate; rotating the toggle about a fixed pin that is aligned with the toggle rotation axis, by the vertical movement of the drive shaft; and rotating the toggle about the second pin, by the vertical movement of the drive shaft, such that the second pin is rotates about the fixed pin.

Additionally or alternatively, the first pin is not configured to slide relative to the link.

Additionally or alternatively, the method further includes bending, with the cutter, the at least one component lead against a bottom of the printed circuit board.

BRIEF DESCRIPTION OF THE DRAWINGS

The above and further advantages of this invention may be better understood by referring to the following description in conjunction with the accompanying drawings, in which like reference numerals indicate like elements and features in the various figures. For clarity, not every element may be labeled in every figure. The drawings are not necessarily to scale, emphasis instead being placed upon illustrating the principles of the invention.

DETAILED DESCRIPTION

Reference in the specification to "one embodiment" or "an embodiment" means that a particular feature, structure or characteristic described in connection with the embodiment is included in at least one embodiment of the teaching. References to a particular embodiment within the specification do not necessarily all refer to the same embodiment.

The present teaching will now be described in more detail with reference to exemplary embodiments thereof as shown in the accompanying drawings. While the present teaching is described in conjunction with various embodiments and examples, it is not intended that the present teaching be limited to such embodiments. On the contrary, the present teaching encompasses various alternatives, modifications and equivalents, as will be appreciated by those of skill in the art. Those of ordinary skill having access to the teaching herein will recognize additional implementations, modifications and embodiments, as well as other fields of use, which are within the scope of the present disclosure as described herein.

Figure 1:
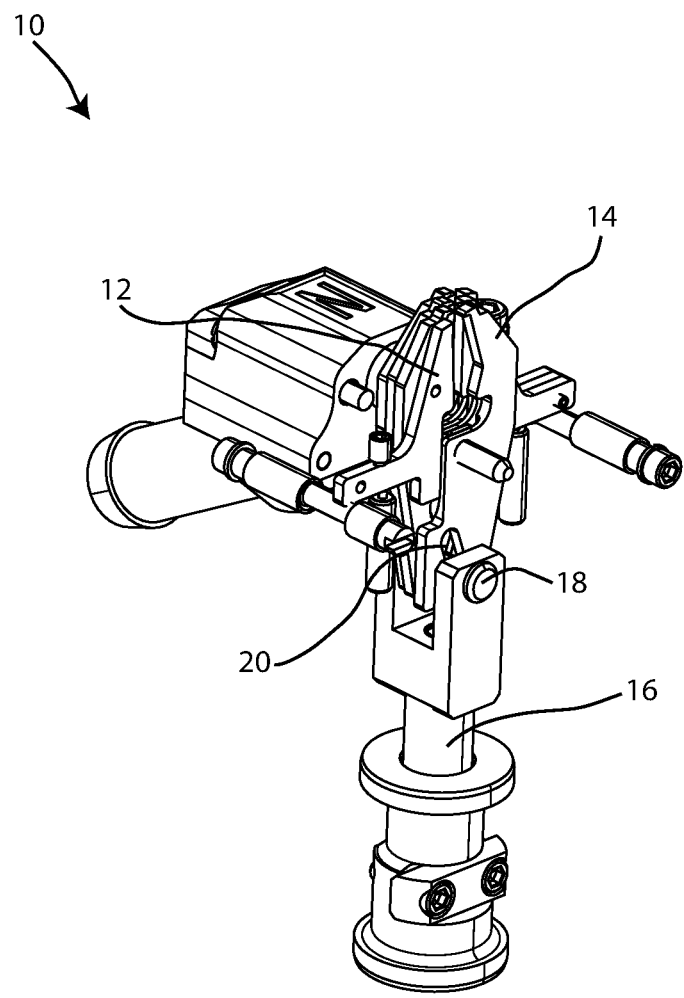
FIG. 1 depicts a perspective view of an example of a prior art clinch mechanism.

FIG. 1 depicts a perspective view of an example of a prior art clinch mechanism 10. As shown, the clinch mechanism 10 includes at least one anvil 12 and at least one pivoting cutter 14. In particular, the prior art clinch mechanism 10 is shown with four anvil/cutter pairs. The cutters 14 are driven by a drive shaft 16 that is configured to move vertically in a linear fashion by way of an air cylinder (not shown). As shown, vertical movement of the drive shaft 16 creates movement of the cutter 14 relative to the anvil 12 that remains stationary. When a lead of an electronic component that has been inserted into a PCB is positioned between the cutter 14 and the anvil 12, movement of the cutter 14 causes the lead to be pressed against the anvil 12 by the moving cutter 14 to cut the lead. After cutting, the cutter 14 continues pushing the now-cut lead after the lower part of the lead has been cut. This bends the lead up against the bottom of the PCB, which would be located directly above the clinch mechanism 10 in use. This clinches the lead close to the bottom of the PCB under side to hold the component in place for the following process steps until the PCB is wave soldered or the component is otherwise soldered into place by hand or by an automated soldering machine.

The prior art clinch mechanism 10 is driven by the vertical movement of the drive shaft 16. This vertical movement moves the cutter 14 toward the anvil 12. The prior art clinch mechanism 10 connect the vertical movement to a pin 18. The pin 18 slides on a flat steel slot 20. This sliding movement over time leads to unnecessary wear. Further, in the embodiment shown, prior art clinch mechanism 10 moves the cutter 14 parallel to the bottom of the PCB (not shown). This parallel movement of the cutter 14 leads to high forces on the leads during the cutting and clinching process. As shown the cutter 14 and anvil 12 parts are elaborately machined and ground out of hardened steel, which makes these wearable parts expensive to replace.

In the subject of this disclosure regarding the embodiments shown in FIGS. 2-9, the sliding of pins on flat surfaces (as shown with the pin 18 of the prior art) is eliminated in the cutter drive mechanism. This is accomplished by adding a link and a toggle between the actuator and the moving cutter. Further, wherein the prior art cut/clinch mechanisms of FIG. 1 includes a pin that slides in a slot driving the cutter, the new design provides a toggle having an involute gear shaped tooth. This tooth shaped toggle engages the corresponding involute trapezoidal slot or contact surface in the cutter. With this shape the tooth shaped toggle rolls on the surface of the cutter, instead of sliding. Embodiments described herein are configured to virtually eliminate the replacement of part inside the cut/clinch mechanism other than for wear of the actual lead cutting surfaces.

Furthermore the design of the new cut/clinch mechanism provides for cutter and anvil designs that are made out of flat plate material and are only two-dimensional, simplifying the manufacturing process compared to state of the art parts that are machined and ground on all sides. The plate shaped design furthermore allows for a simple extension of the configuration from 5 mm tooling (with a stack of 3 sets of cutters and anvils to insert electronic components with 2 or 3 leads at 2.5 mm or 1/10" pitch) to 7.5 mm tooling (for components with up to 4 leads) and 10 mm tooling (for components with up to 5 leads) by respectively adding 1 set of plates and 2 sets of plates. The flat plate design of the tooling enables not just easy configurations for the different type of electronic components, but also reduces the manufacturing cost of the parts.

By means of replacement of cylindrical pins that slide on a flat surface with a line contact by cylindrical pins that slide in cylindrical link holes, the theoretical contact area has infinitely increased. Wear and the development of play are significantly reduced with the embodiments of the present disclosure. The improvement described herein are configured to reduce the need for costly replacement parts, especially in the common case where the equipment runs for 24 hours per day, 7 days per week. Furthermore, the wear of the prior art parts creates play and the subsequent hitting impacts when the parts engage, making the assemblies noisy, requiring frequent adjustment and causing lower quality cut/clinch performance.

Moreover, the prior art cutter moves horizontally relative to the drive shaft. Unlike the prior art, the cutters of the present invention described hereinbelow move at a non-perpendicular angle relative to the drive shaft, and a non-parallel angle relative to the PCB. This causes the pulling force on the leads to be significantly reduced and improves the capability of handling sensitive components, or components with hard to cut leads.

Figure 2:
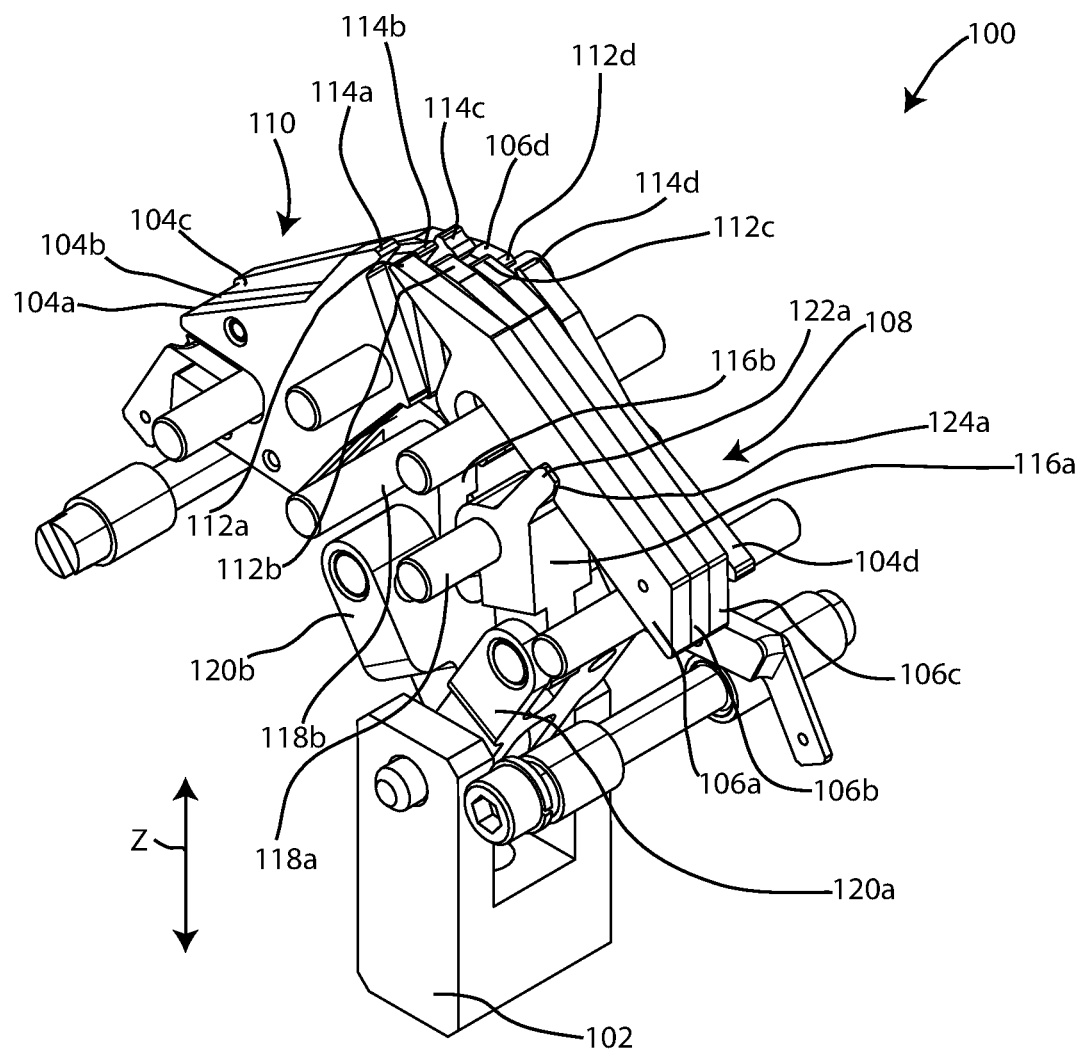
FIG. 2 depicts a perspective view of a first side of a clinch mechanism for assembling a printed circuit board with electronic components having four sets of one cutter and one anvil, in accordance with one embodiment.

FIG. 2 depicts a perspective view of a first side of a clinch mechanism 100 for assembling a printed circuit board with electronic components having four sets of one cutter and one anvil, in accordance with one embodiment. The clinch mechanism 100 includes a drive shaft 102 configured to move along a vertical axis Z. Four stationary anvils 104*a*, 104*b*, 104*c*, 104*d* are shown that are configured to remain stationary during movement of the drive shaft 102. Likewise, four cutters 106*a*, 106*b*, 106*c*, 106*d* are shown, each configured to move with movement of the drive shaft 102. Each of the respective anvils 104*a*, 104*b*, 104*c*, 104*d* pairs with one of the cutters 106*a*, 106*b*, 106*c*, 106*d* so that vertical movement by the drive shaft 102 causes movement of the cutter 106*a* across the respective anvil 104*a*, movement of the cutter 106*b* across the respective anvil 104*b*, movement of the cutter 106*c* across the respective anvil 104*c*, and movement of the cutter 106*d* across the respective anvil 104*d*. Specifically, the cutters each include a respective cutting tip 112*a*, 112*b*, 112*c*, 112*d*. With vertical movement by the drive shaft 102, the cutting tips 112*a*, 112*b*, 112*c*, 112*d* are configured move across respective tips 114*a*, 114*b*, 114*c*, 114*d* of the respective stationary anvils 104*a*, 104*b*, 104*c*, 104*d*.

The clinch mechanism 100 includes two stacks 108, 110 of cutters and/or anvils. A first stack 108 includes the cutters 106*a*, 106*b*, 106*c* and the anvil 104*d*. A second stack 110 includes the anvils 104*a*, 104*b*, 104*c* and the cutter 106*d*. Thus, in the embodiment shown the first stack 108 includes three cutters and a single anvil, while the second stack 110 includes the inverse—three anvils and a single cutter. Other embodiments, are contemplated, such as a stack including all cutters and a second stack including all anvils, each stack including half cutters and half anvils, or the like. Whatever the embodiment, movement of the drive shaft 102 is configured to simultaneously move all of the cutters 106a, 106b, 106c, 106d relative to the drive shaft 102 while the anvils 104a, 104b, 104c, 104d remain stationary relative to the drive shaft 102.

Each of the first and second stacks 108, 110 may be made up of cutters 106a, 106b, 106c, 106d and anvils 104a, 104b, 104c, 104d that are machined out of solid material flat plates. Thus, two dimensional machining, and not three dimensional machining, may be required in order to machine and fashion the flat plates of the stacks 108, 110. The stacks 108, 110 are shown with the respective plates stacked up against each other. However, an extremely small space may be located between each of the respective plates of the cutters 106a, 106b, 106c, 106d and anvils 104a, 104b, 104c, 104d in order to prevent rubbing, friction, sliding and/or wear of the plate parts.

The clinch mechanism 100 further includes a first toggle 116a and a second toggle 116b. The toggles 116a, 116b are each configured to rotate about a rotational axis defined by, or aligned with, respective fixed pins 118a, 118b which are configured to remain stationary relative to the movement of the drive shaft 102. Further, the clinch mechanism 100 includes a first link 120a, and a second link 120b. Each of the links 120a, 120b are rotatably attached to and extending between the drive shaft 102 and respective toggles 116a, 116b.

Figure 3:
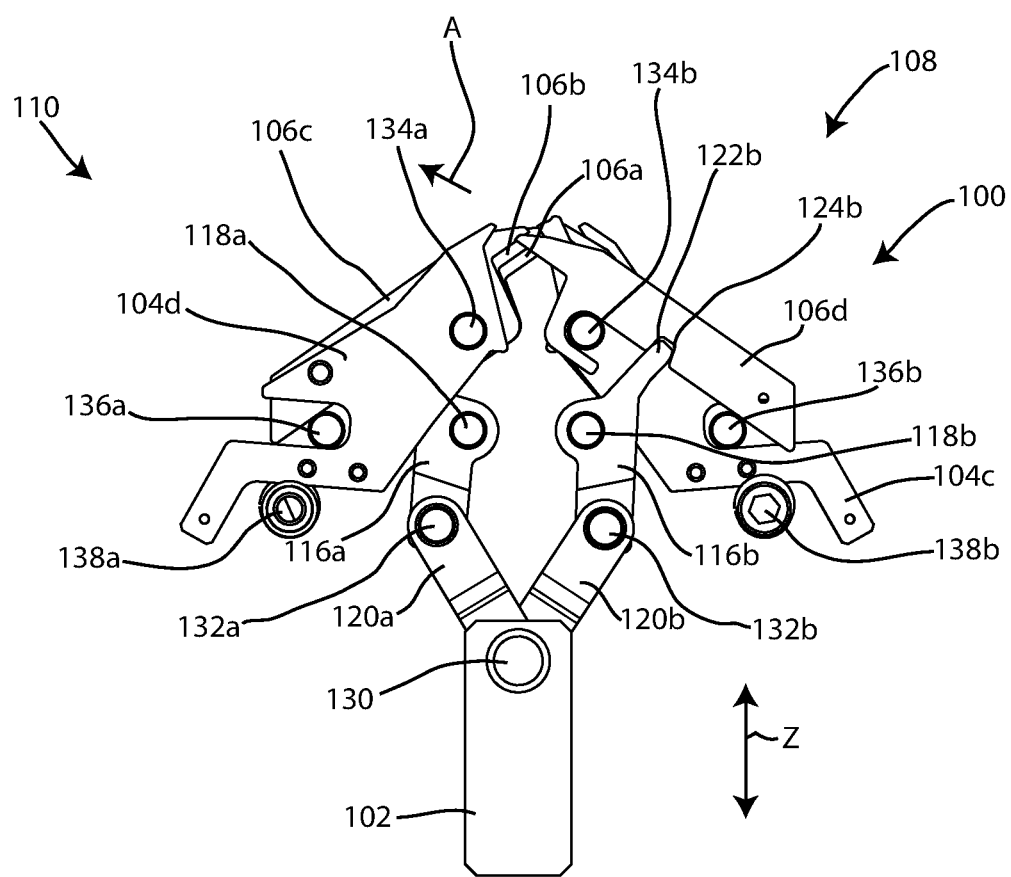
FIG. 3 depicts a side view of a second side of the clinch mechanism of FIG. 2 with the cutters in an open position according to one embodiment.
Figure 4:
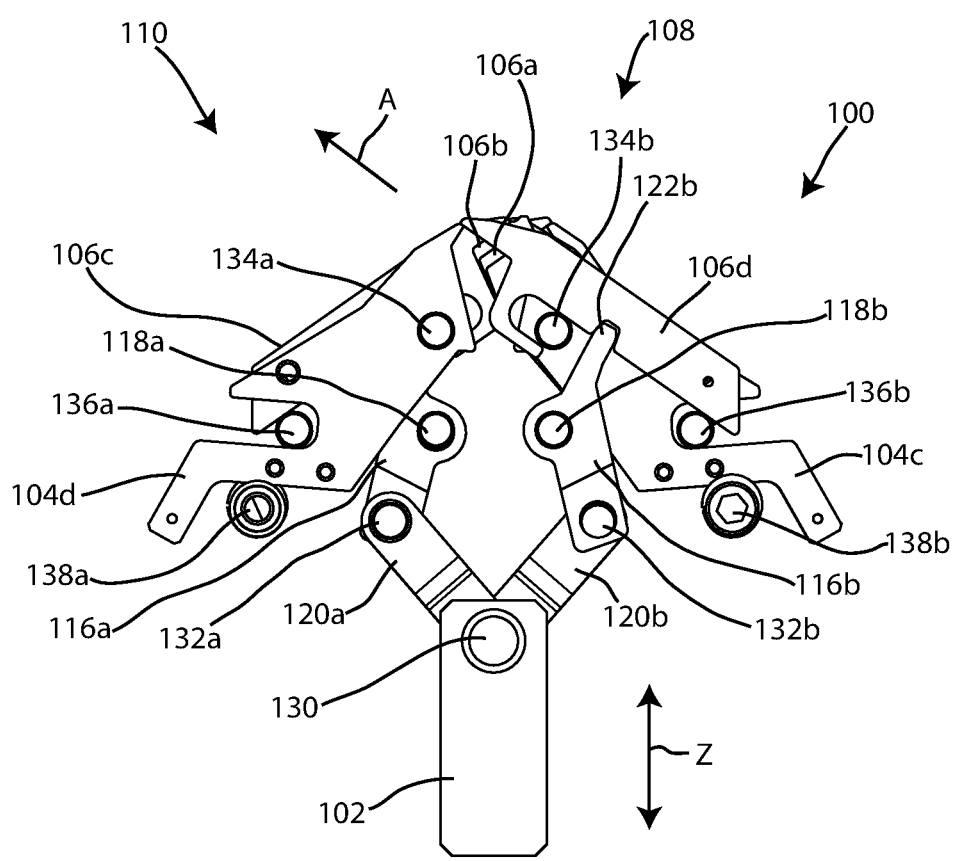
FIG. 4 depicts a side view of the second side of the clinch mechanism of FIGS. 2-3 with the cutters in a closed position according to one embodiment.

FIG. 3 depicts a side view of a second side of the clinch mechanism 100 of FIG. 2 with the cutters 106a, 106b, 106c, 106d in an open position according to one embodiment. FIG. 4 depicts a side view of the second side of the clinch mechanism 100 of FIGS. 2-3 with the cutters 106a, 106b, 106c, 106d in a closed position according to one embodiment. In the views in FIGS. 3 and 4, the clinch mechanism 100 has been rotated relative to the view shown in FIG. 2 so that the back side is visible.

The movement of the drive shaft 102 upward along the vertical axis Z (i.e. the movement between FIG. 3 and FIG. 4) is configured to move top of the links 120a, 120b and the bottom of the toggles 116a, 116b outward. This vertical driveshaft movement is configured to rotate the toggle 116a about the fixed pin 118a in a clockwise direction with respect to the perspective shown in FIGS. 3 and 4. Likewise, this vertical driveshaft movement is configured to rotate the toggle 116b about the fixed pin 118b in a counter-clockwise direction with respect to the perspective shown in FIGS. 3 and 4.

Each of the toggles 116a, 116b includes a contact portion 122a (shown in FIG. 2), 122b located at the top tip of the toggles 116a, 116b. The contact portions 122a, 122b are each configured to roll across an engagement portion 124a (shown in FIG. 2), 124b of each of the cutters 106a, 106b, 106c, 106d without causing sliding friction between the toggles 116a, 116b and the cutters 106a, 106b, 106c, 106d. This rolling pressure is configured to impart movement on the cutters 106a, 106b, 106c, 106d relative to the respective stationary anvils 104a, 104b, 104c, 104d.

The drive shaft 102 includes a first pin 130 about which the links 120a, 120b are configured to rotate when the drive shaft 102 moves along the vertical axis Z. This movement of the 120a, 120b about the first pin 130 of the drive shaft is accomplished without a mechanically sliding pin. Thus, the first pin 130 is not configured to slide relative to the links 120a, 120b. Further, as shown a second pin 132a, 132b extends through each of the respective toggles 116a, 116b and the links 120a, 120b about which the respective toggles 116a, 116b, and links 120a, 120b are configured to rotate. The toggles 116a, 116b are each further configured to rotate about their respective second pins 132a, 132b. The second pins 132a, 132b are each respectively configured to rotate about their respective fixed pins 118a, 118b when the drive shaft 102 moves along the vertical axis Z.

As shown, the cutters 106a, 106b, 106c, 106d are each configured to move linearly along an axis A. The axis A is a non-vertical and non-horizontal path which is not parallel to either the vertical axis Z of the drive shaft or the horizontal PCB which would be located above the clinch mechanism 100 in use. Instead, the cutters 106a, 106b, 106c, 106d are configured to move, via movement of the drive shaft 102 along the vertical direction V, along this angled path defined by the axis A. The path defined by the axis A may be guided by additional pins 134a, 136a for cutters of the second stack 110, and may be guided by additional pins 134b, 136b for cutters of the first stack 108. The top guide pins 134a, 134b are aligned with a channel cut into the bottom of each of the cutters 106a, 106b, 106c, 106d so that the cutter can move relative to the guide pins 134a, 134b. A guide plate (not shown) may be fashioned above the cutters 106a, 106b, 106c, 106d to provide additional guidance for retaining the movement of the cutters 106a, 106b, 106c, 106d along the axis A. These pins 134a, 134b, 136a, 136b are shown as stationary pins which do not move with movement of the drive shaft 10. The pins 134a, 134b, 136a, 136b may further be configured to retain the stationary anvils 104a, 104b, 104c, 104d in a stationary position relative to the drive shaft 102. Further, additional pins 138a, 138b may be configured to provide stationary support for the base of the anvils 104a, 104b, 104c, 104d.

Figure 5:
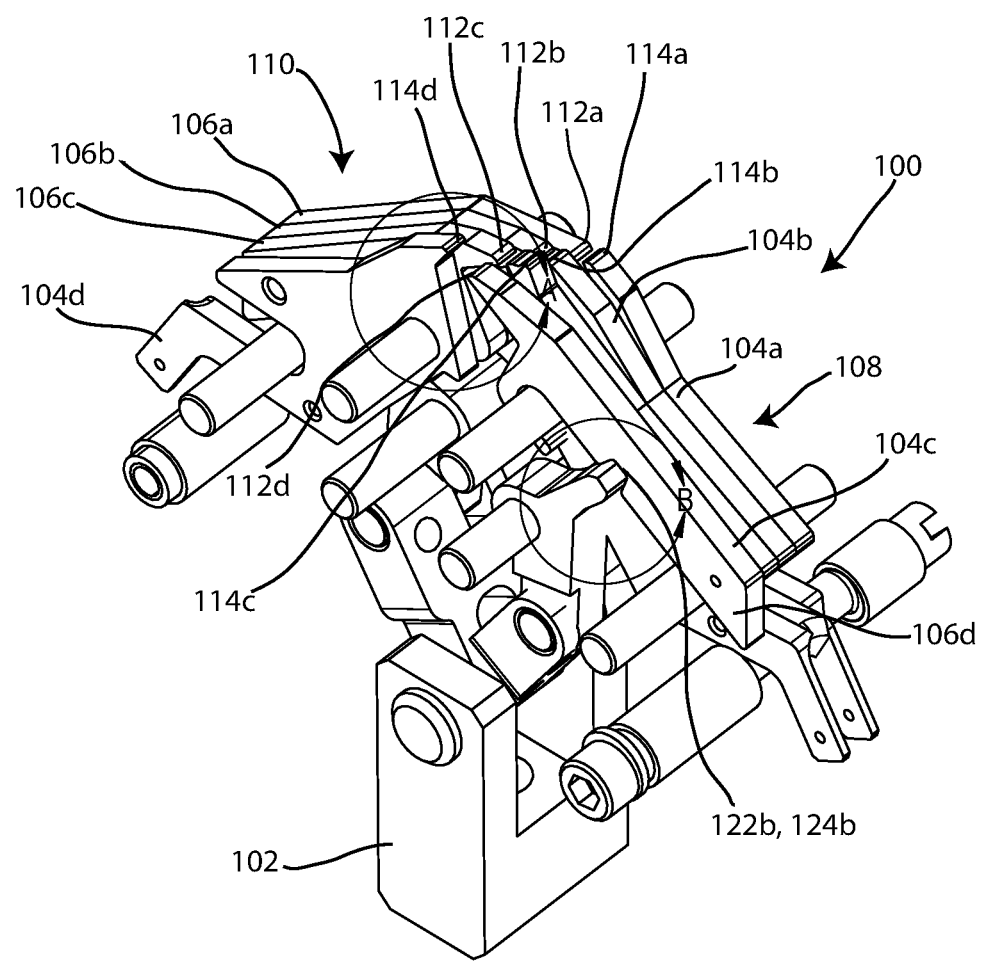
FIG. 5 depicts a perspective view of the second side of the clinch mechanism of FIGS. 2-4, in accordance with one embodiment.
Figure 6A:
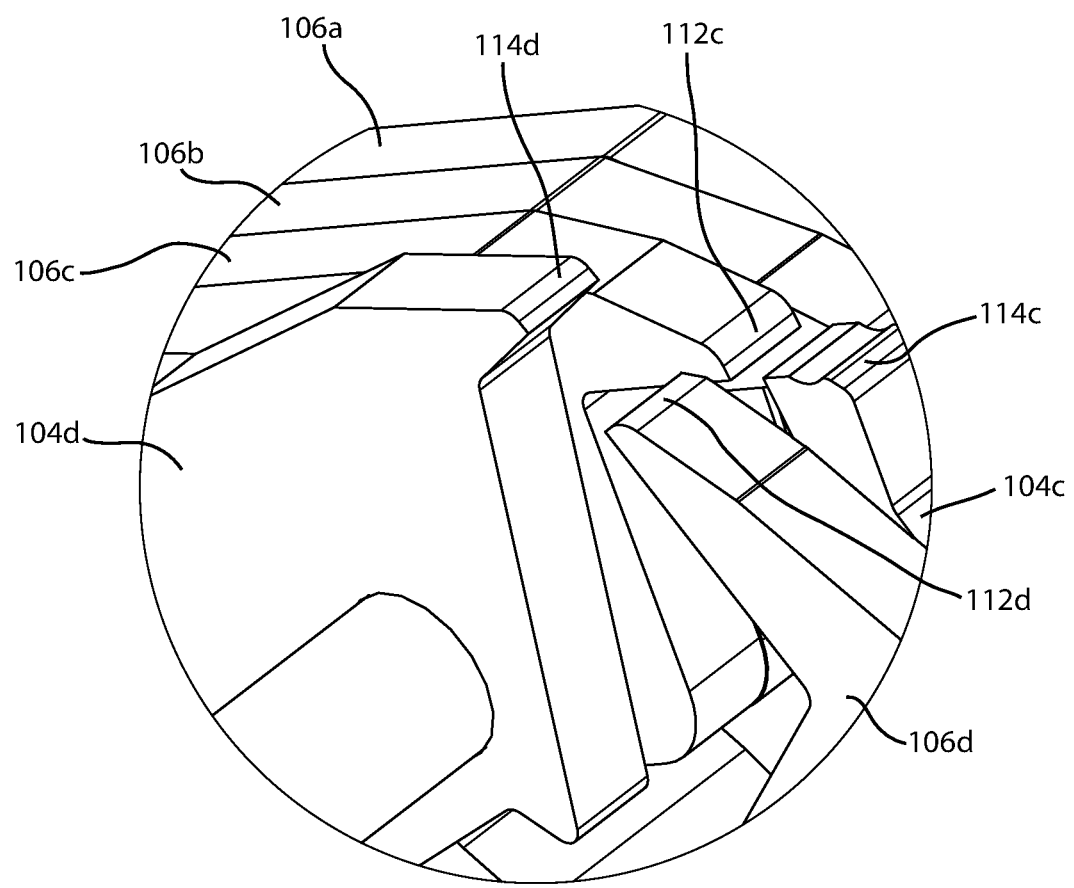
FIG. 6A depicts an enlarged view of the area encompassed by circle A of FIG. 5, showing a partial view of an anvil cutting edge and cutter edge of the clinch mechanism of FIGS. 2-4, in accordance with one embodiment.

FIG. 5 depicts a perspective view of the second side of the clinch mechanism 100 of FIGS. 2-4, in accordance with one embodiment. The clinch mechanism 100 is shown in an open state prior to the drive shaft 102 being moved vertically upward. FIG. 6A depicts an enlarged view of the area encompassed by circle A of FIG. 5, showing a partial view of stationary anvils 104c, 104d and the cutters 106a, 106b, 106c, 106d of the clinch mechanism 100 of FIGS. 2-4, in accordance with one embodiment. Specifically, the enlarged view shows the tips 114c, 114d of the anvils 104c, 104d, and the tips 112c, 112d of the cutters 106c, 106d. A space remains between the respective tips 112c, 114c, and 112d, 114d to allow for the electrical leads to be placed therebetween. Further, the cutting tips 112c, 112d are shown at a vertical level below the respective anvil tips 114c, 114d to allow for the cutters to move at an upward angle along the axis A during cutting.

Figure 6B:
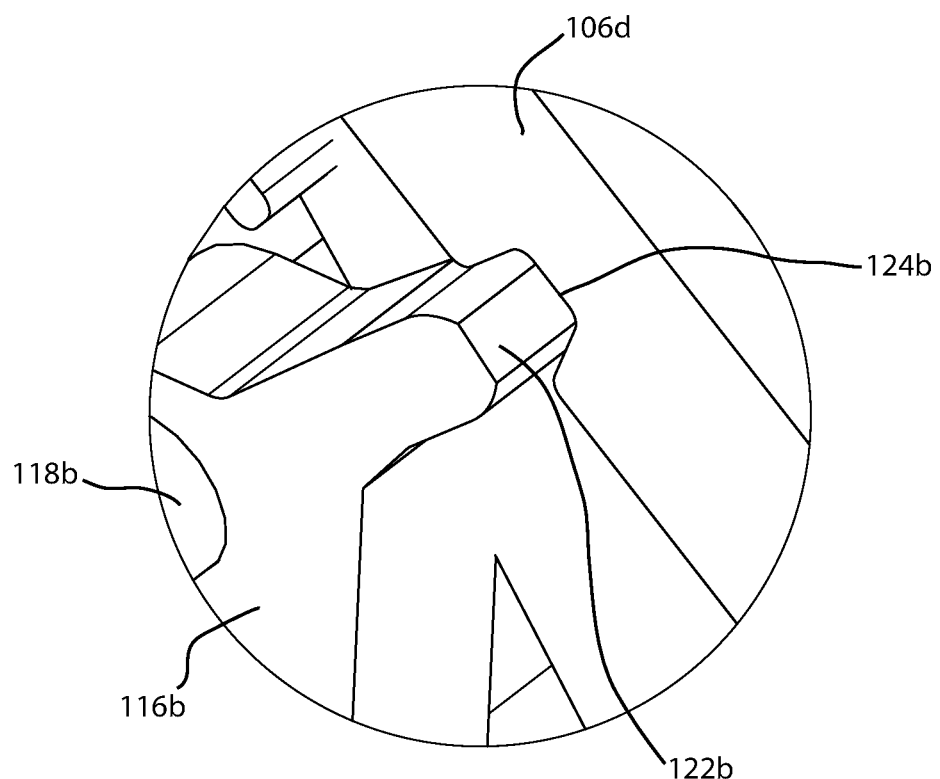
FIG. 6B depicts an enlarged view of the area encompassed by circle B of FIG. 5, showing a partial perspective view of the gear profile of the toggle of the clinch mechanism of FIGS. 2-5A, in accordance with one embodiment.

FIG. 6B depicts an enlarged view of the area encompassed by circle B of FIG. 5, showing a partial perspective view of the profile of the toggle 116b of the clinch mechanism 100 of FIGS. 2-6A, in accordance with one embodiment. Specifically, the contact portion 122b of the toggle 116b includes an involute gear shaped tooth. Similarly, the contact portion 124b of the cutter 106d includes an involute trapezoidal slot configured to receive the involute gear shaped tooth of the contact portion 122 of the toggle 116b. When the toggle 116b is rotated by the vertical movement of the drive shaft 102, the involute gear shaped tooth of the toggle 116b is configured to roll across the involute trapezoidal slot of the cutter 106d to impart movement on the cutter along the axis A relative to the respective stationary anvil 104d. This movement is thus created without a sliding pin extending through the cutter 106d and/or the toggle 116b. While not shown in this view, the toggle 116a includes a similarly shaped contact portion 122a. Further, the contact portions 122a, 122b extend across the entire thickness of the respective stacks 108, 110 in order to simultaneously move each of the respective cutters 106a, 106b, 106c, 106d in the stack 108, 110. Likewise while only one cutter 106d and contact portion 124b thereof is shown, each other respective cutter 106a, 106b, 106c includes a respective contact portion for receiving the involute gear shaped tooth of the respective toggles 116a, 116b.

Figure 7:
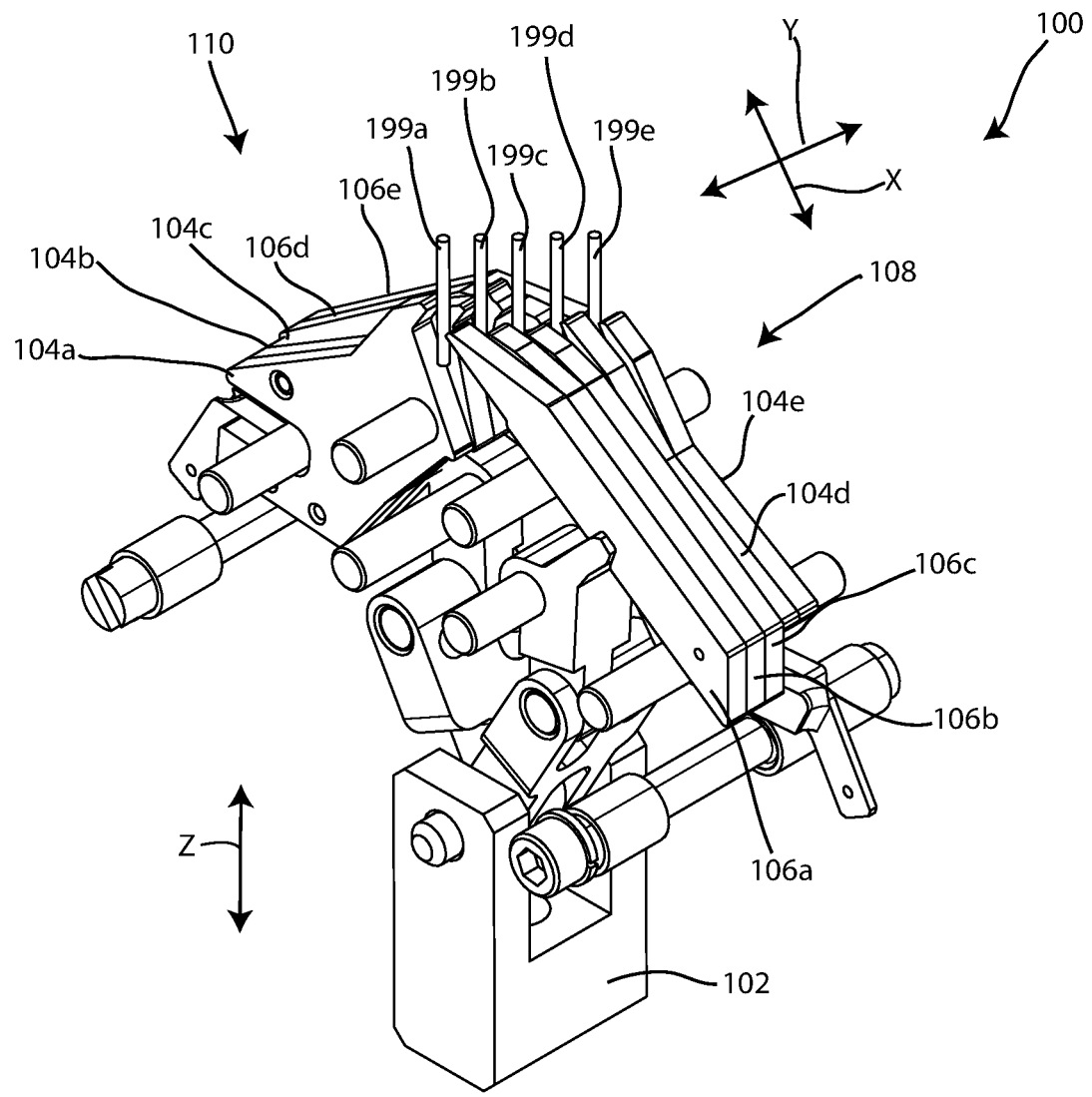
FIG. 7 depicts a perspective view of a first side of the clinch mechanism of FIGS. 2-6B with an additional set of one cutter and one anvil and with electronic leads inserted between each sets of one cutter and one anvil, in accordance with one embodiment.

FIG. 7 depicts a perspective view of the first side of the clinch mechanism 100 of FIGS. 2-6B with an additional set of one cutter and one anvil, and with electronic leads 199a, 199b, 199c, 199d, 199e inserted between each sets of one cutter and one anvil, in accordance with one embodiment. Here, the clinch mechanism 100 is shown having an extra set of one cutter 106e and one anvil 104e installed. The clinch mechanism 100 shown in FIG. 7 may still be the same mechanism shown in FIGS. 2-6, but modified with the extra set in each of the stacks 108, 110. Thus, the clinch mechanism 100 includes five cutter and anvil sets installed. The clinch mechanism 100 is shown in an open state prior to cutting, with each anvil/cutter set having one of the electronic leads 199a, 199b, 199c, 199d, 199e inserted therebetween. While not shown, it should be understood that these leads 199a, 199b, 199c, 199d, 199e are portions of an electronic component that is inserted through a PCB located above the clinch mechanism and oriented perpendicular with the vertical axis Z. As shown, the dimensions of the components of the clinch mechanism 100 provides for staggered receiving locations for the leads 199a, 199b, 199c, 199d, 199e. Specifically, the receiving locations are staggered both in the X (left/right) axis and in the Y (front/back) axis.

Figure 8:
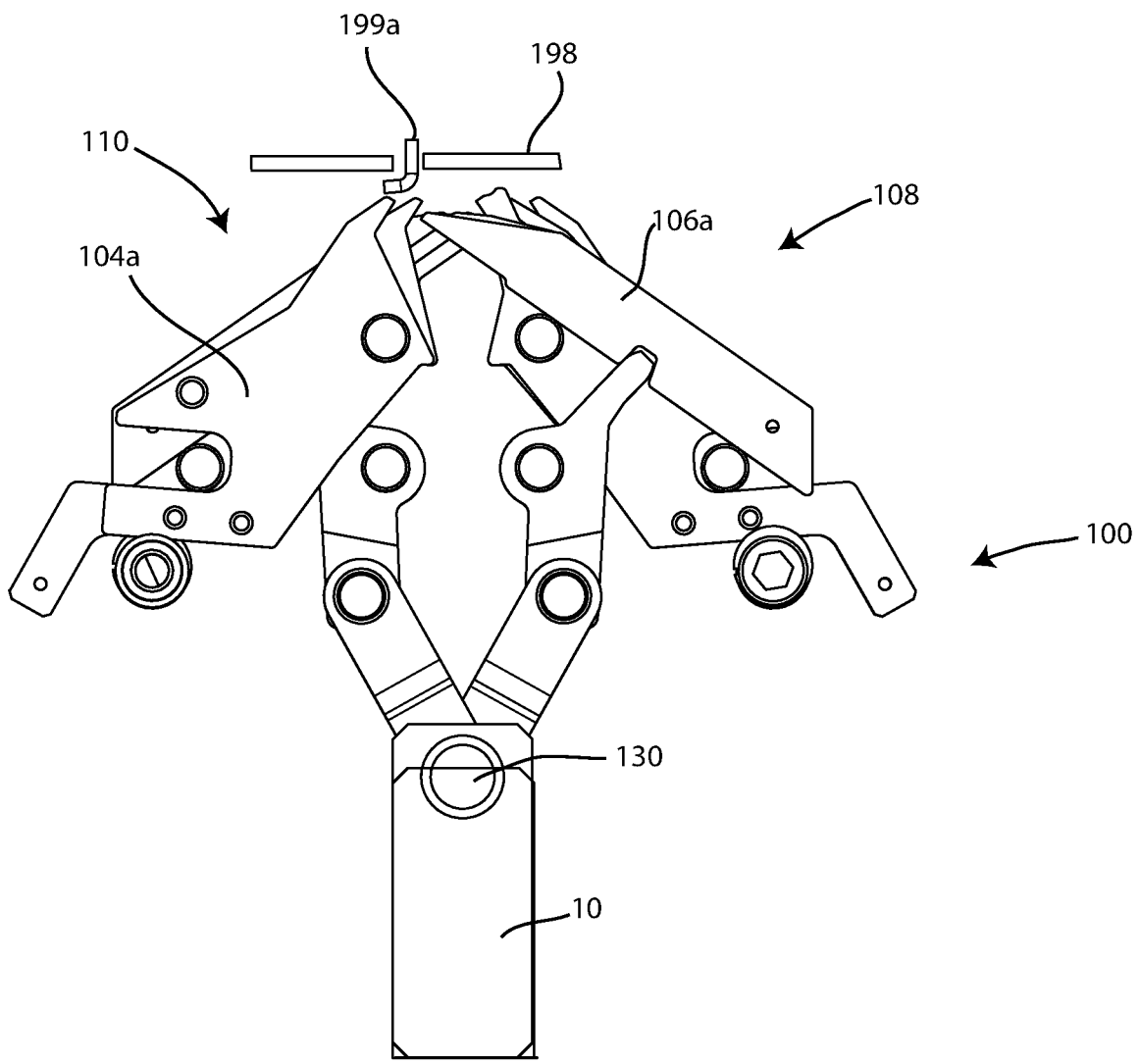
FIG. 8 depicts a side view of the first side of the clinch mechanism of FIGS. 2-7 after having cut the electronic leads and bent the electronic leads toward a PCB, in accordance with one embodiment.

FIG. 8 depicts a side view of the first side of the clinch mechanism 100 of FIGS. 2-7 after having cut the electronic leads and bent the electronic leads toward a PCB 198, in accordance with one embodiment. As shown, the electronic lead 199a is shown having been cut and bent by the cutter 106a after being inserted between the cutter 106a and the anvil 104a as shown in FIG. 7. The electronic lead 199a has further been bent by the cutter 106a toward a bottom of the PCB. After this bending of the electronic lead 199a, the cutter 106a has been shown to begin to retract back to the open position to await another electronic lead insertion and a subsequent cutting and bending process.

Figure 9:
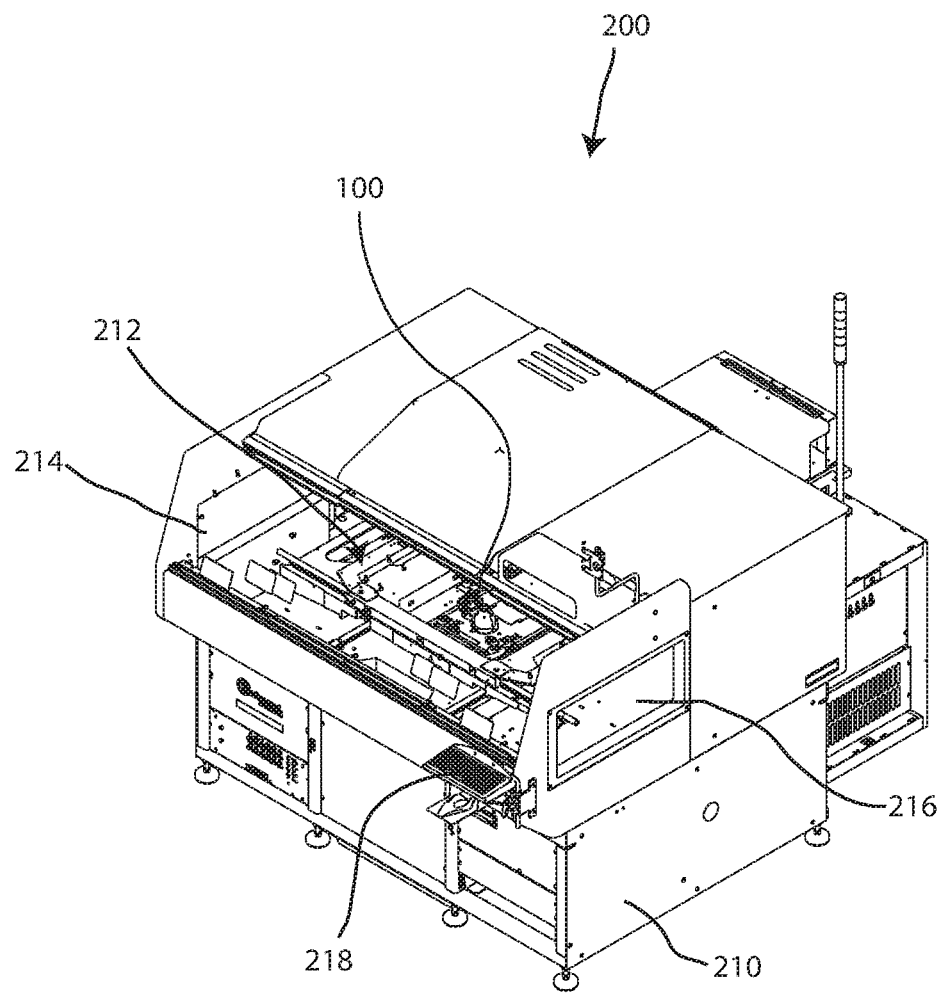
FIG. 9 depicts a PCB assembly machine including the clinch mechanism of FIGS. 2-7 in accordance with embodiments described herein.

FIG. 9 depicts a PCB assembly machine 200 including the clinch mechanism 100 of FIGS. 2-7 in accordance with embodiments described herein. The PCB assembly machine 200 is shown including a frame 210 that encloses a board handling system 212 that is accessible through a first opening 214 and a second opening 216. The PCB assembly machine may receive a PCB through one of the openings 214, 216 and transfer the PCB to the station above the clinch mechanism 100 for placement of electronic components. The PCB assembly machine may include one or more assembly heads configured to pick and place the components from the head(s) into the PCB. A feeder system (not shown) may be attached to the machine in order to provide the electronic components to the head(s). Further the PCB assembly machine may include a control system that includes a programmable user interface 218 configured to control the board handling, the head(s) and the clinch mechanism 100 according to an appropriate PCB assembly process.

Further described herein are methods of assembling a printed circuit board with electronic components. Methods contemplated herein include a step of receiving, by a clinch mechanism, such as the clinch mechanism 100, at least one component lead, such as one of the component leads 199, between a cutter, such as one of the cutters 106a, 106b, 106c, 106d, 106e, and a stationary anvil, such as one of the stationary anvils 104a, 104b, 104c, 104d, 104e, of the clinch mechanism. Methods may include moving, by a drive shaft of the clinch mechanism, such as the drive shaft 102, along a vertical axis, such as the vertical axis Z. Methods may include rotating a toggle, such as one of the toggles 116a, 116b, by the moving of the drive shaft, about a toggle rotation axis, such as the axis aligned with one of the stationary pins 118a, 118b. Methods may further include rolling, by a contact portion of the toggle, such as one of the contact portions 122a, 122b, across an engagement portion of the cutter, such as one of the engagement portions 124a, 124b, as a result of the rotating of the toggle. Methods may include imparting movement, by the contact portion of the toggle, on the cutter relative to the stationary anvil, and cutting the at least one component lead by moving a cutting tip, such as one of the cutting tips 112a, 112b, 112c, 112d of the cutter across the stationary anvil.

Still further, methods may include inserting, by a radial lead insertion machine, such as the PCB assembly machine 200, the at least one component lead of an electronic component through at least one hole in a printed circuit board located above the clinch mechanism. Methods may include bending, by the cutter, the cut at least one component lead against the bottom of the printed circuit board.

In accordance to the methods described herein, the contact portion of the toggle includes an involute gear shaped tooth and the contact portion of the cutter includes an involute trapezoidal slot. Methods may include rolling, by the involute gear shaped tooth of the toggle, across the involute trapezoidal slot of the cutter and imparting movement, by the involute gear shaped tooth of the toggle, on the cutter relative to the stationary anvil without a sliding pin extending through the toggle and the cutter.

In accordance to the methods described herein, the cutter and the stationary anvil may be each machined from a flat plate and the clinch mechanism includes a plurality of cutters and a plurality of corresponding stationary anvils such that the moving of the drive shaft along a vertical axis moves each of the plurality of cutters relative to the corresponding stationary anvils simultaneously.

Methods may further include moving the cutter linearly along an axis that is not perpendicular to the vertical axis, such as the axis A.

Still further, methods may include rotating a link, such as one of the links 120a, 120b, that is attached to and extending between each of the drive shaft and the toggle, by the vertical movement of the drive shaft. In accordance with methods the drive shaft may include a first pin, such as the joint pin 130, about which the link is configured to rotate when the drive shaft moves along the vertical axis, and a second pin, such as one of the second pins 132a, 132b extends through each of the toggle and the link about which the toggle and link are configured to rotate. The first pin may not be configured to slide relative to the link. Methods may further include rotating the toggle about a fixed pin, such as the stationary pins 118a, 118b, that is aligned with the toggle rotation axis, by the vertical movement of the drive shaft, and rotating the toggle about the second pin, by the vertical movement of the drive shaft, such that the second pin is rotates about the fixed pin. Methods may further include bending, with the cutter, the at least one component lead against a bottom of the printed circuit board.

While the invention has been shown and described with reference to specific embodiments, it should be understood by those skilled in the art that various changes in form and detail may be made therein without departing from the spirit and scope of the invention as recited in the accompanying claims.

We claim:

1. A clinch mechanism for assembling a printed circuit board with electronic components comprising:
   a drive shaft configured to move along a vertical axis;
   a stationary anvil configured to remain stationary during movement of the drive shaft;
   a cutter having a cutting tip, wherein movement of the drive shaft along the vertical axis is configured to move the cutter relative to the stationary anvil, wherein the movement of the cutter by the drive shaft is configured to move the cutting tip across the stationary anvil to cut an electronic lead located between the cutting tip and the stationary anvil;
   a toggle configured to rotate about a toggle rotation axis, wherein movement of the drive shaft along the vertical axis is configured to rotate the toggle about the toggle rotation axis, the toggle including a contact portion configured to roll across an engagement portion of the cutter in order to impart movement on the cutter relative to the stationary anvil, wherein the contact portion of the toggle includes an involute gear shaped tooth and wherein the engagement portion of the cutter includes an involute trapezoidal slot; and
   a link rotatably attached to and extending between each of the drive shaft and the toggle.

2. The clinch mechanism of claim 1, wherein the involute gear shaped tooth is configured to roll across the involute trapezoidal slot of the cutter to impart movement on the cutter relative to the stationary anvil without a sliding pin extending through the toggle and the cutter.

3. The clinch mechanism of claim 1, wherein the cutter and the stationary anvil are each machined from a flat plate.

4. The clinch mechanism of claim 1, further comprising a plurality of cutters and a plurality of corresponding stationary anvils, wherein movement of the drive shaft along the vertical axis is configured to move each of the plurality of cutters relative to the corresponding stationary anvils simultaneously.

5. The clinch mechanism of claim 4, wherein the plurality of cutters and the plurality of corresponding stationary anvils comprise a first stack and a second stack and wherein each of the first stack and the second stack include at least one of the plurality of cutters and at least one of the plurality of corresponding stationary anvils.

6. The clinch mechanism of claim 1, wherein the cutter is configured to move linearly along an axis that is not perpendicular to the vertical axis.

7. The clinch mechanism of claim 1, wherein the drive shaft includes a first pin about which the link is configured to rotate when the drive shaft moves along the vertical axis, and wherein a second pin extends through each of the toggle and the link about which the toggle and link are configured to rotate.

8. The clinch mechanism of claim 7, wherein the toggle is configured to rotate about a fixed pin that is aligned with the toggle rotation axis, wherein the toggle is further configured to rotate about the second pin, wherein the second pin is configured to rotate about the fixed pin when the drive shaft moves along the vertical axis.

9. The clinch mechanism of claim 7, wherein the first pin is not configured to slide relative to the link.

10. An assembly machine comprising:
    a board handling system configured to move a printed circuit board within the assembly machine;
    one or more assembly heads configured to pick and place components onto the printed circuit board; and
    a clinch mechanism that includes:
      a drive shaft configured to move along a vertical axis;
      a stationary anvil configured to remain stationary during movement of the drive shaft;
      a cutter having a cutting tip, wherein movement of the drive shaft along the vertical axis is configured to move the cutter relative to the stationary anvil, wherein the movement of the cutter by the drive shaft is configured to move the cutting tip across the stationary anvil to cut an electronic lead located between the cutting tip and the stationary anvil;
      a toggle configured to rotate about a toggle rotation axis, wherein movement of the drive shaft along the vertical axis is configured to rotate the toggle about the toggle rotation axis, the toggle including a contact portion configured to roll across an engagement portion of the cutter in order to impart movement on the cutter relative to the stationary anvil, wherein a contact portion of the toggle includes an involute gear shaped tooth and wherein the engagement portion of the cutter includes an involute trapezoidal slot; and
    a link rotatably attached to and extending between each of the drive shaft and the toggle.

11. A method of assembling a printed circuit board with electronic components comprising:
    receiving, by a clinch mechanism, at least one component lead between a cutter and a stationary anvil of the clinch mechanism;
    moving, by a drive shaft of the clinch mechanism, along a vertical axis;
    rotating a link that is attached to and extending between each of the drive shaft and the toggle, by the vertical movement of the drive shaft;
    rotating a toggle, by the moving of the drive shaft, about a toggle rotation axis;
    rolling, by a contact portion of the toggle, across a contact portion of the cutter as a result of the rotating of the toggle, wherein the contact portion of the toggle includes an involute gear shaped tooth and wherein the contact portion of the cutter includes an involute trapezoidal slot;
    imparting movement, by the contact portion of the toggle, on the cutter relative to the stationary anvil; and
    cutting the at least one component lead by moving a cutting tip of the cutter across the stationary anvil.

12. The method of claim 11, further comprising:
    inserting, by a radial lead insertion machine, the at least one component lead of an electronic component through at least one hole in a printed circuit board located above the clinch mechanism.

13. The method of claim 12, further comprising:
    bending, by the cutter, the cut at least one component lead against the printed circuit board.

14. The method of claim 11, further comprising:
    rolling, by the involute gear shaped tooth of the toggle, across the involute trapezoidal slot of the cutter; and
    imparting movement, by the involute gear shaped tooth of the toggle, on the cutter relative to the stationary anvil without a sliding pin extending through the toggle and the cutter.

15. The method of claim 11, wherein the cutter and the stationary anvil are each machined from a flat plate.

16. The method of claim 11, wherein the clinch mechanism includes a plurality of cutters and a plurality of corresponding stationary anvils, wherein the moving of the drive shaft along a vertical axis moves each of the plurality of cutters relative to the corresponding stationary anvils simultaneously.

17. The method of claim 11, further comprising moving the cutter linearly along an axis that is not perpendicular to the vertical axis.

18. The method of claim 11,
   wherein the drive shaft includes a first pin about which the link is configured to rotate when the drive shaft moves along the vertical axis, and wherein a second pin extends through each of the toggle and the link about which the toggle and link are configured to rotate, the method further comprising;
   rotating the toggle about a fixed pin that is aligned with the toggle rotation axis, by the vertical movement of the drive shaft; and
   rotating the toggle about the second pin, by the vertical movement of the drive shaft, such that the second pin is rotates about the fixed pin.

19. The method of claim 18, wherein the first pin is not configured to slide relative to the link.

20. The method of claim 12, further comprising:
   bending, with the cutter, the at least one component lead against a bottom of the printed circuit board.

\* \* \* \* \*